United States Patent
Ye et al.

(10) Patent No.: US 6,479,313 B1
(45) Date of Patent: Nov. 12, 2002

(54) METHOD OF MANUFACTURING GAN-BASED P-TYPE COMPOUND SEMICONDUCTORS AND LIGHT EMITTING DIODES

(75) Inventors: Jinlin Ye, South Easton, MA (US); Jyh-Chia Chen, Ellicott City, MD (US); Shirong Liao, South Easton, MA (US); Hong K. Choi, Sharon, MA (US); John C. C. Fan, Brookline, MA (US)

(73) Assignee: Kopin Corporation, Taunton, MA (US)

(*) Notice: Subject to any disclaimer, the term of this patent is extended or adjusted under 35 U.S.C. 154(b) by 0 days.

(21) Appl. No.: 09/866,442

(22) Filed: May 25, 2001

(51) Int. Cl.[7] .......................... H01L 21/00; H01L 21/20
(52) U.S. Cl. .................... 438/47; 438/505; 438/506
(58) Field of Search ................. 438/505, 45–47, 438/506

(56) References Cited

U.S. PATENT DOCUMENTS

| | | | |
|---|---|---|---|
| 5,061,643 A | * 10/1991 | Yagi | 437/19 |
| 5,306,662 A | 4/1994 | Nakamura et al. | 437/107 |
| 5,354,708 A | 10/1994 | Taskar et al. | 437/108 |
| 5,602,418 A | * 2/1997 | Imai et al. | 57/627 |
| 5,657,335 A | 8/1997 | Rubin et al. | 372/44 |
| 5,783,233 A | 7/1998 | Taskar et al. | 438/46 |
| 5,891,790 A | 4/1999 | Keller et al. | 438/508 |
| 5,926,726 A | 7/1999 | Bour et al. | 438/507 |
| 6,017,807 A | 1/2000 | Furukawa et al. | 438/502 |
| 6,043,140 A | 3/2000 | Kawai et al. | 438/503 |
| 6,037,596 A | * 11/2000 | Shu et al. | 250/370.1 |
| 2001/0198849 | * 9/2001 | Manabe et al. | 438/46 |
| 2002/0008286 A1 | * 1/2002 | Yamazaki et al. | 257/359 |

FOREIGN PATENT DOCUMENTS

| | | | | |
|---|---|---|---|---|
| JP | 58017678 A2 | 2/1983 | | H01L/29/91 |
| JP | 4064270 A2 | 2/1992 | | H01L/39/24 |
| JP | 5029215 A2 | 2/1993 | | H01L/21/20 |
| JP | 5029239 A2 | 2/1993 | | H01L/21/265 |
| JP | 031084 A2 | 1/2000 | | H01L/21/268 |
| JP | 100810 A2 | 4/2000 | | H01L/21/316 |

OTHER PUBLICATIONS

Nakamura, Shuji et al., "High–power InGaN single–quantum–well–structure blue violet light–emitting diodes," *Appl. Phys. Lett.*, 67(13):1868–1870 (1995).

Nakamura, Shuji et al., "Candela–class high–brightness InGaN/AlGaN double–heterostructure blue–light–emitting diodes," *Appl. Phys. Lett.*, 64(13):1687–1689 (1994).

Nakamura, Shuji et al., "High–power InGaN/GaN double–heterostructure violet light emitting diodes," *Appl. Phys. Lett.*, 62(19):2390–2392.

Akasaki, I. et al., "Conductivity control of GaN and fabrication of UV/blueGaN light emitting devices," *Physica B*, 185:428–432 (1993).

Nakamura, Shuji et al., "High–Brightness InGaN Blue, Green and Yellow Light–Emitting Diodes with Quantum Well Structures," *Jpn. J. Appl. Phys.*, 34:797–799 (1995).

* cited by examiner

Primary Examiner—Olik Chaudhuri
Assistant Examiner—William Vesperman
(74) Attorney, Agent, or Firm—Hamilton, Brook, Smith and Reynolds, P.C.

(57) ABSTRACT

Compound semiconductor material is irradiated with x-ray radiation to activate a dopant material. Active carrier concentration efficiency may be improved over known methods, including conventional thermal annealing. The method may be employed for III–V group compounds, including GaN-based semiconductors, doped with p-type material to form low resistivity p-GaN. The method may be further employed to manufacture GaN-based LEDs, including blue LEDs, having improved forward bias voltage and light-emitting efficiency.

24 Claims, 8 Drawing Sheets

METHOD OF MANUFACTURING GAN-BASED P-TYPE COMPOUND SEMICONDUCTORS AND LIGHT EMITTING DIODES

BACKGROUND OF THE INVENTION

Recently, much attention has been focused on GaN-based compound semiconductors (e.g., $Ga_xAl_{1-x}N$ or $In_xGa_{1-x}N$, where $0 \leq x \leq 1$) for blue and green light emitting diode (LED) applications. One important reason is that GaN-based LEDs have been found to exhibit excellent light emission at room temperature.

In general, GaN-based LEDs comprise a multilayer structure in which n-type and p-type GaN are stacked on a substrate (most commonly a sapphire substrate), and $In_xGa_{1-x}N$/GaN multiple quantum wells are sandwiched between the p-type and n-type GaN layers. A number of methods for growing the multilayer structure are known in the art, including metalorganic chemical vapor deposition (MOCVD), molecular beam epitaxy (MBE) and hydride vapor phase epitaxy (HVPE).

It is also known in the art that these conventional growth methods for compound semiconductor structures have proven problematic, particularly with respect to forming a p-type GaN-based layer suitable for LED applications. In general, GaN layers formed by known growth methods, such as MOCVD, and doped with p-type material such as magnesium, behave like a semi-insulating or high-resistive material. It is generally understood that this results from hydrogen passivation, or hydrogen that is present in the reaction chamber bonding with the p-type dopant and thus preventing the dopant in the GaN from behaving as an active carrier. Because of this phenomenon, p-type GaN having a sufficiently low resistivity to form the p-n junction required for LED applications cannot be produced by conventional techniques.

Various attempts have been made to overcome the difficulties in obtaining p-type GaN-based compound semiconductors. In one technique known as low-energy electron-beam irradiation (LEEBI), a high-resistive semi-insulating GaN layer, which is doped with a p-type impurity (Mg), is formed on top of the multilayers of the GaN compound semiconductor. Then, while maintaining the semiconductor compound at temperatures up to 600° C., the compound is irradiated with an electron beam having an acceleration voltage of 5–15 kV in order to reduce the resistance of the p-doped region near the sample surface. However, with this method, reduction in the resistance of the p-doped layer can be achieved only up to the point that the electron beam penetrates the sample, i.e. a very thin surface portion less than about 0.5 μm deep. Furthermore, this method requires heating the substrate to temperatures up to approximately 600° C. in addition to high-voltage acceleration of the electron beam.

Thermal annealing can be used to activate a small fraction of the dopant as an active carrier. For example, in order to achieve a carrier concentration of $1 \times 10^{18}$ cm$^{-3}$, the concentration of the p-type dopant must be as high as $1 \times 10^{20}$ cm$^{-3}$.

Also, the high level of doping required for the thermal annealing method degrades Hall mobility of the p-type GaN, with a typical value of Mg-doped GaN of only 20 cm$^2$/v-s. Moreover, because of the heavy doping and the degraded top layer crystallinity, the forward bias voltage of GaN-based LEDs cannot be made as low as desired, and the light-emitting efficiency is decreased.

Furthermore, the annealing temperature is typically more than 800° C., which is higher than the temperature used for forming the light emitting layers. These high temperatures may additionally degrade the light-emitting efficiency of the device.

SUMMARY OF THE INVENTION

A method for activating a dopant in a semiconductor comprises irradiating the semiconductor with x-ray radiation. This process can be used to fabricate low-resistance p-type compound semiconductors for example, including III–V Group compound semiconductors, such as GaN-based semiconductors. The x-ray radiation may be generated by an x-ray source and directed to the surface of the doped compound semiconductor wafer. In certain embodiments, the x-ray source has an accelerating voltage of approximately 40 kV and an intensity of approximately 0.4 mA, for example. Additionally, the position of the sample may be changed with respect to the incident x-ray radiation so that the incident angle of the x-ray radiation sweeps through a limited angular range during the irradiation process. According to at least one embodiment, the limited angular range is approximately 100–5000 arc sec.

In contrast to known methods for activating dopants in semiconductor materials, this method can be performed at room temperature in an atmospheric, clean room, or processing chamber environment. The time duration of the x-ray irradiation may also be selectively controlled to maximize the carrier concentration of the irradiated samples. Typically, when using an x-ray system such as Model QC1A available from Bede Scientific, Inc., an irradiation time between approximately 4 and 7 minutes is used to achieve the desired dosage.

The present invention further relates to a method for improving the doping efficiency of p-type compound semiconductors. According to certain embodiments, a compound semiconductor is doped with a p-type impurity, such as magnesium, and having a dopant concentration of approximately $1 \times 10^{19}$ cm$^{-3}$, is irradiated with x-ray radiation to produce a p-type compound semiconductor with a carrier concentration of $1 \times 10^{18}$ cm$^{-3}$.

A method of fabricating a p-type compound semiconductor is additionally disclosed, the method comprising the steps of growing a compound semiconductor by using reaction gas containing p-type impurities, and then irradiating the compound semiconductor with x-ray radiation to activate the p-type impurity.

A method of fabricating a compound semiconductor light emitting diode (LED) is further disclosed, the method comprising the steps of growing a compound semiconductor LED structure using a known epitaxial growth process, and then irradiating the LED with x-ray radiation to activate a p-type impurity. The LED may be a GaN-based LED, and in particular embodiments, a GaN-based blue LED. In general, the LEDs produced with the x-ray irradiation method of the present invention demonstrate improved forward bias voltage and light-emitting efficiency over previously known methods.

Figure 1A:
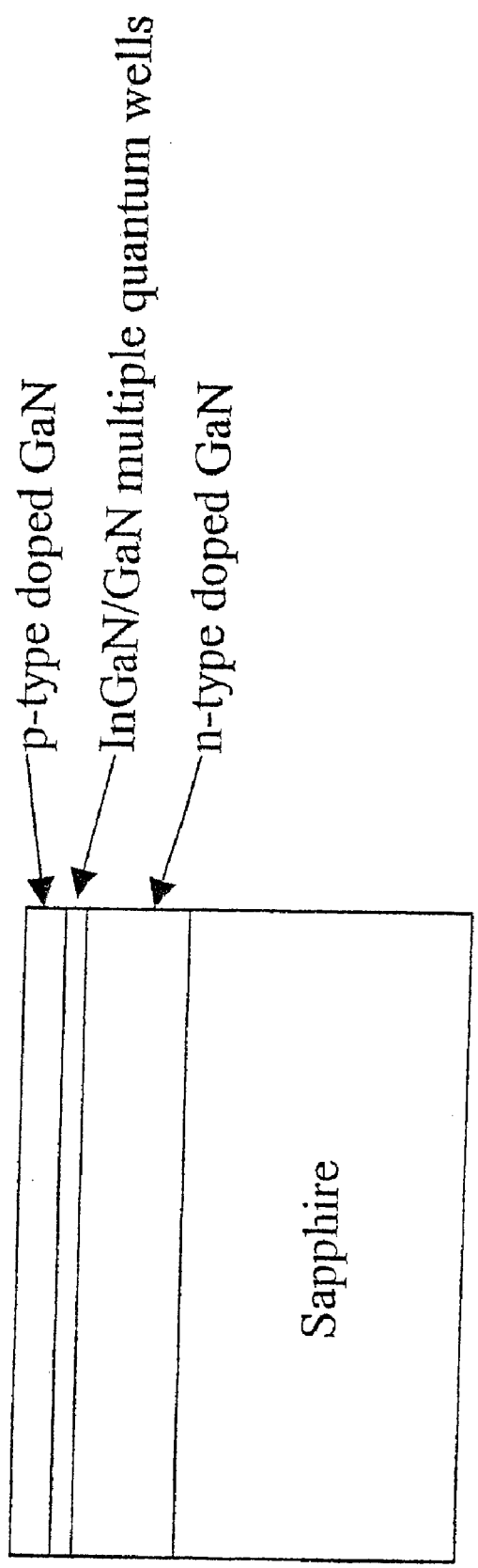
FIG. 1a is a schematic view of a III–V Group layered structure to be irradiated with x-ray radiation according to the principles of the present invention.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1B:
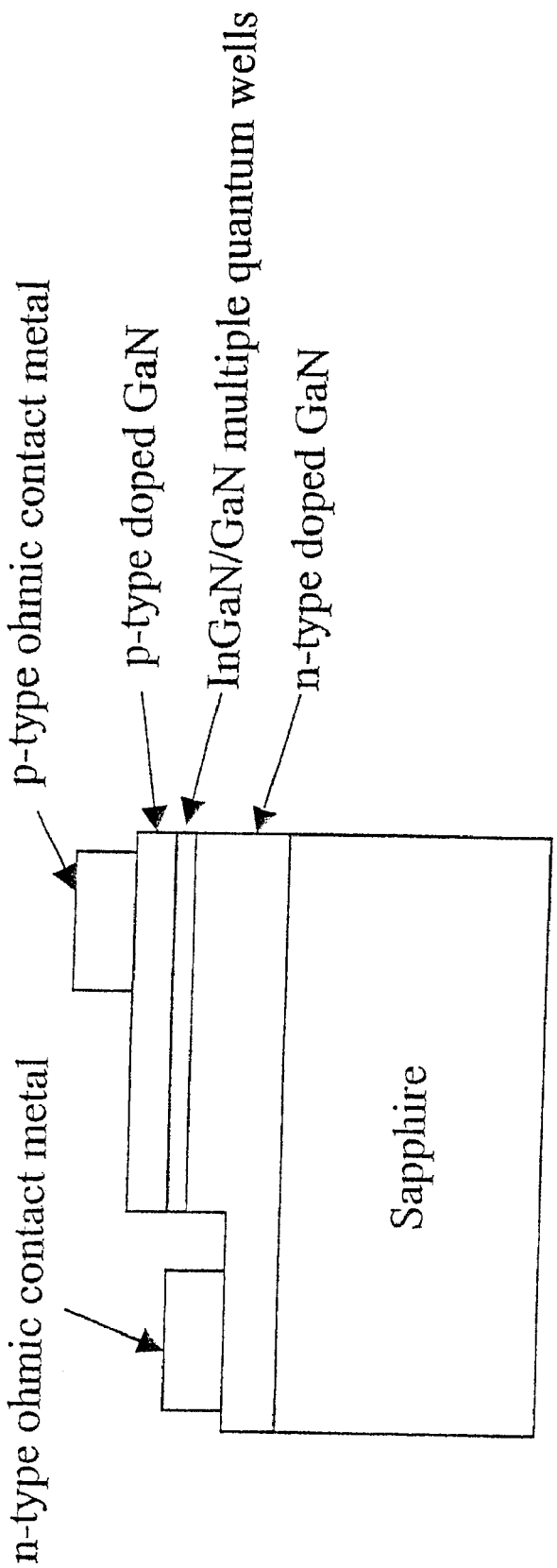
FIG. 1b is a schematic view of an LED device manufactured in accordance with the principles of the present invention.

Turning now to FIG. 1a, a layered III–V Group compound semiconductor structure is illustrated schematically. As shown, the structure comprises a substrate (in this case, a sapphire substrate), a first layer of an n-type doped compound semiconductor (e.g. GaN), multiple quantum wells (e.g. $In_xGa_{1-x}N/GaN$), and a top layer of p-type doped compound semiconductor (e.g. GaN). According to one aspect, the present invention relates to a method for irradiating a compound semiconductor, including a compound semiconductor as illustrated in FIG. 1a, with x-ray radiation. The present invention also relates to a method for fabricating a compound semiconductor light emitting diode (LED), comprising the steps of growing a compound semiconductor LED structure by an epitaxial growth process and irradiating the LED with x-ray radiation to activate a p-type impurity. FIG. 1b schematically illustrates the structure of a finished LED device, the LED device fabricated from a layered III–V Group compound semiconductor, such as the structure shown in FIG. 1a.

Figure 2:
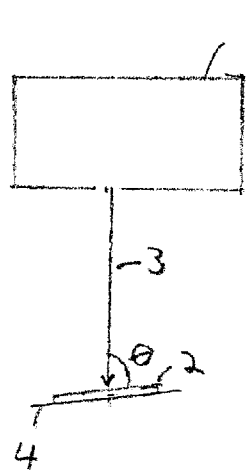
FIG. 2 is a schematic diagram illustrating an x-ray source irradiating a compound semiconductor according to the principles of the present invention.

Turning now to FIG. 2, an x-ray source 1 comprises a device for generating x-ray radiation and directing one or more beams of x-ray radiation 3 at a target area. A conventional double-crystal x-ray diffractometer may be employed as a suitable source for the x-ray radiation. According to some embodiments, the x-ray source tube has an accelerating voltage of 40 kV and an intensity of 0.4 mA for generating the x-ray radiation.

Also illustrated in FIG. 2 is a sample 2 comprising a compound semiconductor, such as a III–V group compound semiconductor wafer, which is positioned for receiving incident x-ray radiation from the x-ray source. As illustrated here, the sample may be located directly below the x-ray source. In certain embodiments, the position of the sample relative to the incident x-ray radiation may be changed during the irradiation process for reasons which will become apparent below. As shown in FIG. 2, the sample is positioned such that the x-ray radiation is incident upon the surface of the sample at an angle, θ. According to one aspect, the sample may be tilted or rocked with respect to at least one axis to change the incident angle θ through a limited angular range. One method for achieving this tilting motion is to position the sample on a stage 4 that is capable of a rocking motion with respect to at least one axis.

Alternatively, the sample may maintain stationary while the x-ray source alters the incident angle of the x-ray radiation through the limited angular range.

The present invention generally relates to a process of irradiating a compound semiconductor containing a p-type impurity with x-ray radiation. According to certain embodiments, the present invention additionally comprises fabricating the compound semiconductor containing the p-type impurity through an epitaxial growth process, followed by a further step of irradiating the compound with x-ray radiation. The irradiation process may be employed in a clean room environment, and may even be performed within the growth chamber itself. Moreover, the step of x-ray irradiation can be performed at room temperature, and in an ambient atmospheric environment.

In general, the present method may be employed to manufacture a p-type semiconductor element from, for instance, a III–V group compound, such as GaN. There are at least three commonly utilized growth methods for GaN-based semiconductors, including metalorganic chemical vapor deposition (MOCVD), molecular beam epitaxy (MBE) and hydride vapor phase epitaxy (HVPE). Of these, MOCVD is the most common method. In this process, metalorganic compound gases such as trimethylgallium (TMG), trimethylindium (TMI), and trimethylaluminum (TMA), along with ammonium, are introduced into a reactor where a substrate, typically sapphire, is located. The epitaxial film of GaN-based semiconductors is grown on the substrate at high temperatures, typically between 700° C. and 1000° C. To improve crystallinity, either an AlN buffer layer or a GaN buffer layer is first grown on the substrate at a lower temperature (e.g. 600° C.) and the GaN compound is grown on the buffer layer at the higher temperatures.

By supplying one or more impurity gases during the growth of the film, a multilayer structure made of n-type and/or p-type GaN compound semiconductors can be manufactured. There are a number of known n-type impurities, such as Si, that are readily used, thus rendering it relatively straightforward to grow characteristic n-type semiconductor layers.

However, employing common p-type impurities, such as Mg or Zn, will not result in an equivalently repeatable, well-defined p-type layer. Generally, p-doped layers formed with conventional techniques behave as a semi-insulating or highly-resistive layers. Because many of the most useful applications for GaN-based semiconductor structures, including LED applications, depend upon the characteristics of a p-n junction, without a characteristic p-type layer with sufficiently low resistance, these practical applications become difficult, if not impossible, to achieve, and any advantages inherent in the GaN-based compound are lost.

According to one aspect, the present invention provides a method for overcoming these and other difficulties by irradiating the p-doped compound semiconductor with x-ray radiation to activate the p-type impurities in the doped layer. It is generally understood in the art that p-type layers formed by conventional methods exhibit high resistance due to gasses in the reaction chamber bonding with p-type impurities to prevent them from acting as acceptors. More specifically, for a GaN-based compound semiconductor grown by the MOVCD method, $NH_3$ is typically used as the source of the N atoms. During the growth process, $NH_3$ is decomposed to generate hydrogen atoms. These hydrogen atoms react with the p-type dopant, such as Mg, and form Mg—H bonds or Mg—H complexes. Thus, GaN into which p-type impurity is doped is highly resistive or semi-insulating. Irradiating the p-doped semiconductor compound with high-energy x-ray photons, however, breaks the Mg—H bonds and releases the hydrogen from the Mg—H bond to leave a characteristic p-type GaN layer. The p-type impurity, Mg, then behaves as an active acceptor.

According to another aspect, the present invention relates to an improved method for activating a p-type impurity in a compound semiconductor material. As discussed above, the LEEBI method may be employed to convert high-resistive GaN material into a p-type conductive material. However, the effectiveness of this method is limited by the penetration of the electron beam: a very thin surface portion less than a depth of about 0.5 $\mu$m. By contrast, the x-ray radiation of the present invention is capable of activating the entire p-doped region at depths greater than 0.5 $\mu$m and up to 3 $\mu$m. Moreover, the present method can be advantageously employed over a wide range of temperatures, including room temperature. The LEEBI method entails heating and maintaining the substrate at a temperature of approximately 600° C.

Figure 3:
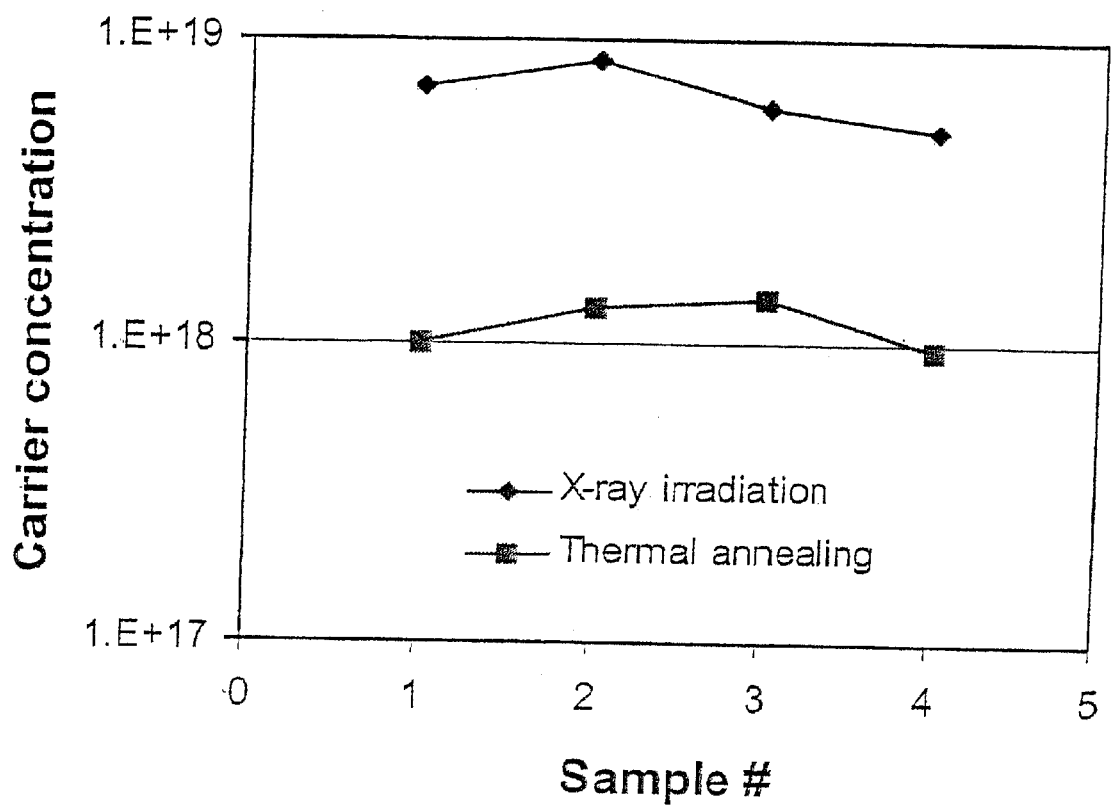
FIG. 3 is a graph illustrating the carrier concentration of Mg-doped p-GaN irradiated by x-ray radiation compared to the carrier concentration of Mg-doped p-GaN treated by conventional post-growth thermal annealing.

The present invention further relates to a method for improving the activation efficiency for a p-type compound semiconductor. FIG. 3 is a graph illustrating the carrier concentration of Mg-doped p-GaN irradiated with x-ray radiation compared to Mg-doped p-GaN treated by conventional thermal annealing. All of the samples were grown under the same conditions: first by growing a GaN buffer layer on a sapphire substrate by the MOVCD method, then forming a 1.5 $\mu$m thick semi-insulating unintentionally doped GaN layer on the buffer layer, and finally growing a 2 $\mu$m thick GaN layer doped with Mg as a p-type impurity on top of the semi-insulating layer. The doping concentration for all samples was approximately $1\times10^{20}$ $cm^{-3}$. The carrier concentration was measured by the conventional capacitance-voltage (C-V) method. The data plotted in FIG. 3 was extracted from the same irradiation conditions and thermal annealing conditions for each group. The conventional thermal annealing was carried out in an MOCVD reactor at a constant temperature of 820° C. for 20 minutes in an $N_2$ atmosphere. The exposure time for the x-ray irradiated samples was 4 minutes.

As shown in FIG. 3, the high-resistivity GaN-based compound semiconductors were converted to p-type semiconductors under both methods. However, the carrier concentration produced by the x-ray irradiation of the present invention is 4–10 times higher than that produced by thermal annealing. Assuming that the percentage of activation does not change with doping concentration, the doped Mg concentration should be as high as $1\times10^{20}$ $cm^{-3}$ for the post-growth thermal annealing in order to achieve a p-type carrier concentration of $1\times10^{18}$ $cm^{-3}$. However, if the x-ray irradiation method is employed instead, the Mg concentration need only be $1\times10^{19}$ $cm^{-3}$ to obtain the equivalent carrier concentration.

Figure 4:
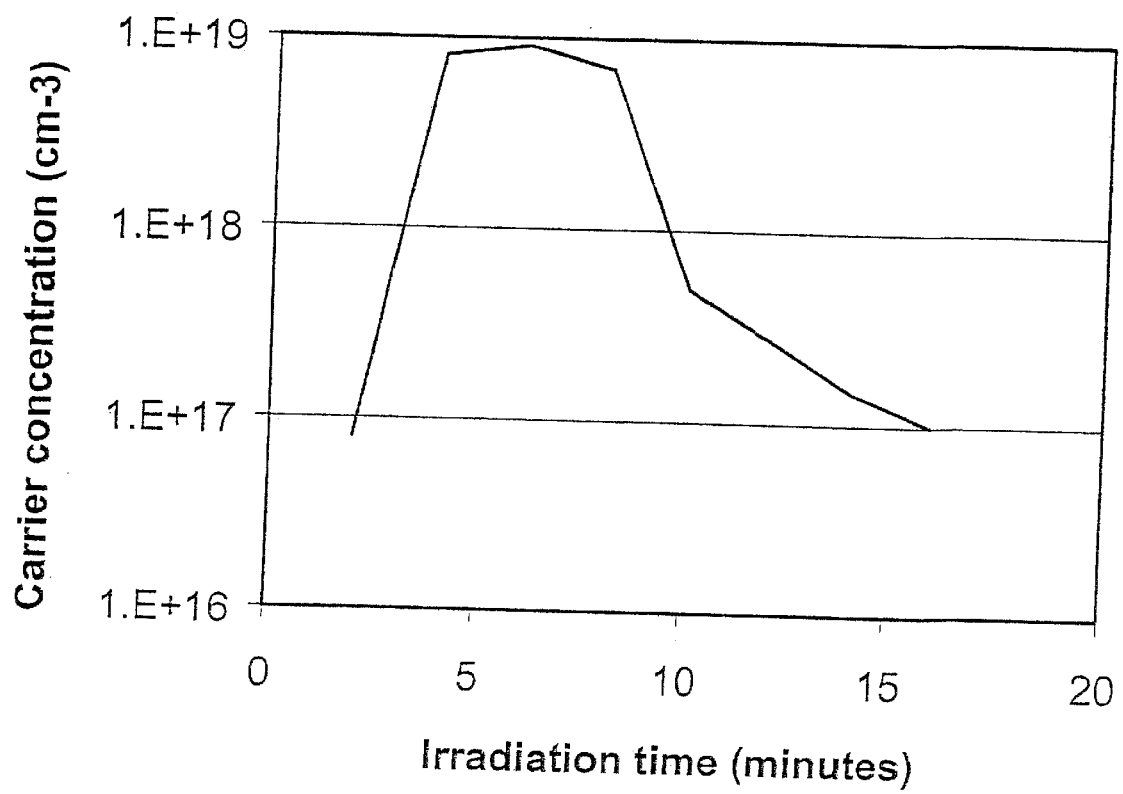
FIG. 4 is a graph illustrating the relationship between carrier concentration and x-ray irradiation time according to the principles of the present invention.

FIG. 4 illustrates the relationship between the x-ray irradiation time and the carrier concentration of a GaN-based compound semiconductor. In this example, the GaN-based compound semiconductor was again formed by growing a GaN buffer layer on the sapphire substrate by the MOCVD method, growing a 1.5 $\mu$m thick semi-insulating unintentionally doped GaN layer on the buffer layer, and growing a 2 $\mu$m thick GaN layer doped with Mg as a p-type impurity on the semi-insulating layer. In this example, however, the samples were x-ray irradiated for different durations. As apparent from FIG. 4, as the irradiation time increases the carrier concentration initially increases sharply, and then reaches a level of approximately $1\times10^{19}$ $cm^{-3}$ when the irradiation time is about 4 minutes. For irradiation times between 4 and 7 minutes, the carrier concentration remains about the same. For longer irradiation times, however, the concentration gradually decreases, most likely due to recombination of the Mg—H bonds and complexes. Preferably, the duration of the x-ray irradiation is selected to maximize the resultant carrier concentration of the p-type semiconductor material.

According to another aspect of the present invention, the high carrier efficiency of the x-ray irradiated p-type compound semiconductor may be further improved by changing the incident angle of the x-ray radiation during the irradiation process. For instance, the targeted sample may be tilted over a angular small range so that the x-ray incident angle likewise changes in that small range. Alternatively, the angle of the incident radiation may be changed directly by, for instance, moving the x-ray source to alter the angle at which the x-ray beams are emitted. In one embodiment, the incident angle is altered through a limited angular range of 5000 arc sec.

Figure 5:
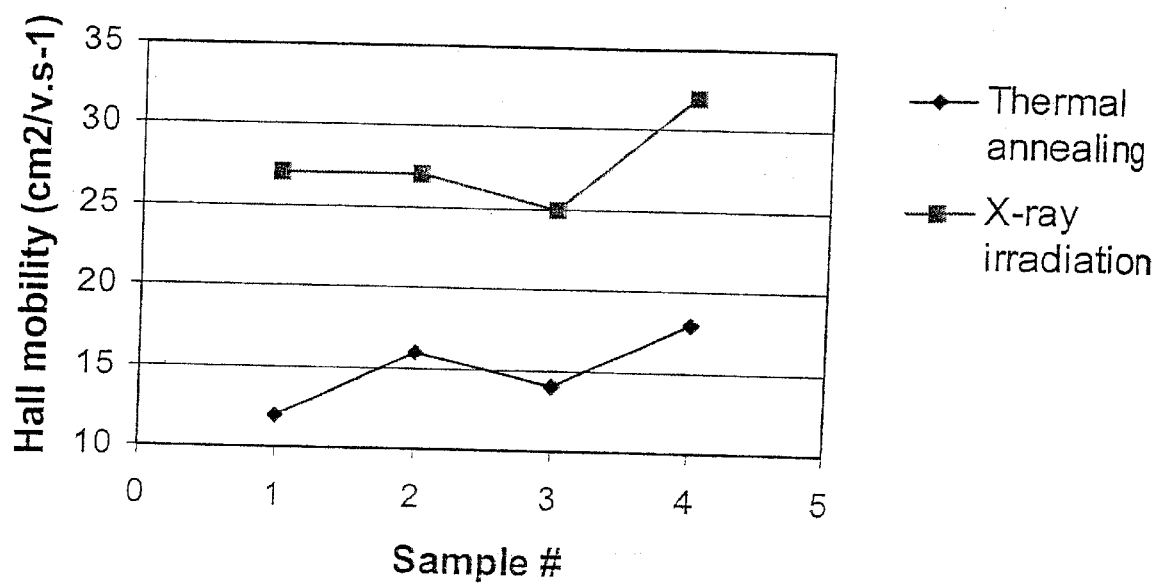
FIG. 5 is a graph illustrating the Hall mobility of Mg-doped p-GaN irradiated by x-ray radiation compared to the Hall mobility of Mg-doped p-GaN treated by conventional post-growth thermal annealing.

FIG. 5 is a graph comparing the Hall mobility between thermally annealed GaN compound semiconductor layers and x-ray irradiated compound semiconductor layers. As before, each GaN-based compound semiconductor was prepared by growing a GaN buffer layer on the sapphire substrate by the MOCVD method, growing a 1.5 $\mu$m thick semi-insulating unintentionally doped GaN layer on the buffer layer, and growing a 2 $\mu$m thick GaN layer doped with Mg as a p-type impurity on the semi-insulating layer. A first group of samples underwent conventional thermal annealing at 820° C. for 20 minutes, while the second group were irradiated by x-ray radiation for 4 minutes according to the principles of the present invention. The doping concentrations for the thermally annealed and x-ray irradiated samples were $1\times10^{20}$ $cm^{-3}$ and $1\times10^{19}$ $cm^{-3}$, respectively, and the post-treatment carrier concentration for both groups was approximately $1\times10^{18}$ $cm^{-3}$. FIG. 5 illustrates the Hall mobility obtained by van der Paw measurement plotted vs. sample series number.

As is apparent from FIG. 5, the Hall mobility of the x-ray irradiated p-type GaN compound semiconductor is 25–35 $cm^2$/v-s, while the Hall mobility of the thermally annealed p-type GaN compound semiconductor is only 10–20 $cm^2$/v-s for the same level of carrier concentration. The higher Hall mobility for the x-ray irradiated samples implies a better crystallinity, which would result in a lower resistance. Thus, an LED employing an x-ray irradiated Mg-doped GaN layer as the p-layer exhibits a lower forward bias voltage than presently allowed using conventional manufacturing techniques.

According to yet another aspect of the present invention, a method of fabricating a compound semiconductor light emitting diode (LED) comprises the steps of growing a compound semiconductor LED by an epitaxial growth method and irradiating the LED with x-ray radiation to activate a p-type impurity. In one embodiment, a GaN-based LED structure is prepared by forming, in the following order, a GaN buffer layer on a sapphire substrate, a 1 μm thick undoped GaN layer, a 2 μm thick Si-doped GaN layer, 5 periods of unintentionally doped $In_xGa_{1-x}N$/GaN multiple quantum wells, and a 0.3 μm thick Mg-doped GaN layer. The thickness of the wells and barriers are 30 and 100 Angstroms, respectively. The Mg-doped GaN layer may then be irradiated by x-ray radiation according to the principles described above to obtain a low resistivity p-type layer.

Figure 6:
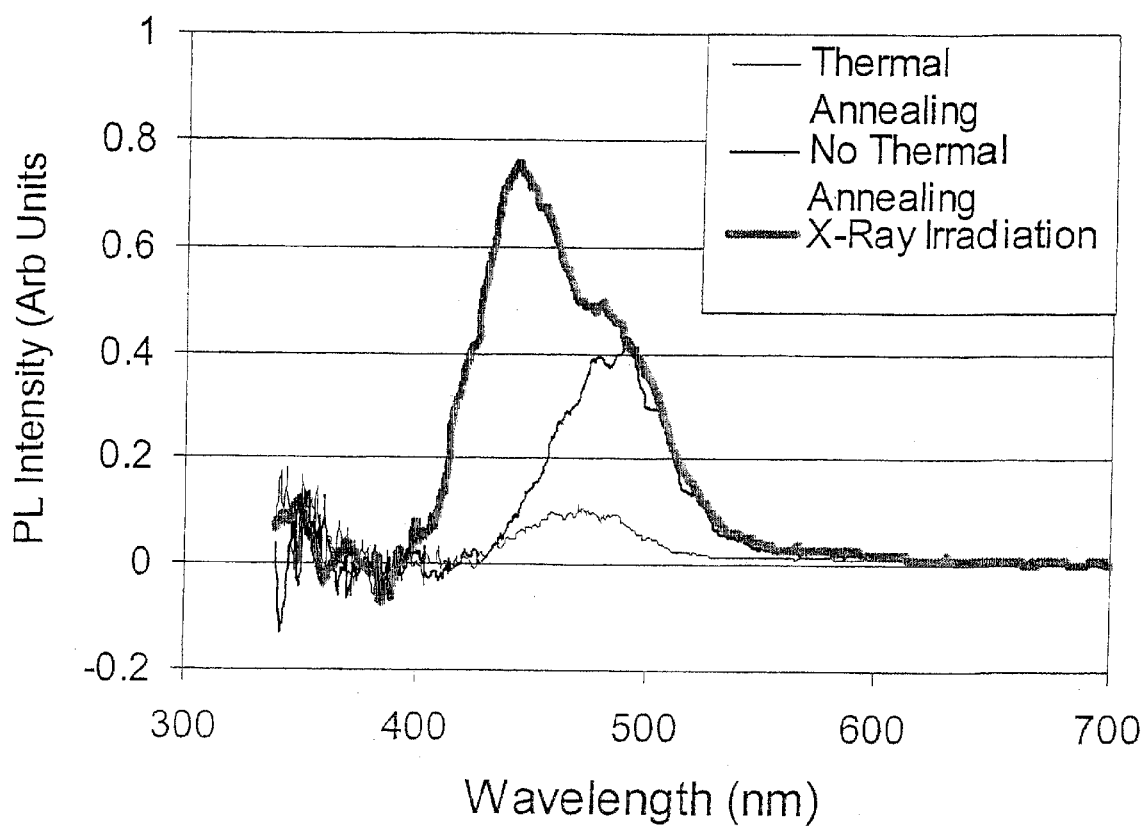
FIG. 6 is a graph comparing the photoluminescence intensity of an Mg-doped GaN-based blue light emitting diode (LED) irradiated by x-ray radiation, an Mg-doped GaN-based blue LED treated by conventional post-growth thermal annealing, and an Mg-doped GaN-based blue LED with no post-growth treatment.

Employing the x-ray irradiation method of the present invention, a GaN-based compound semiconductor LED may be manufactured with lower forward bias voltage and higher efficiency than is attainable using current fabrication techniques. FIG. 6 is a graph comparing the photoluminescence (PL) intensity of GaN-based LED structures as just described where a first group of LEDs has been x-ray irradiated, a second group has undergone conventional thermal annealing, and a third group has not undergone any post-growth treatment. The LED layers were illuminated by a He—Cd laser source to measure the intensity of the photoluminescence as an evaluation of the crystallinity. The higher PL measurements reflect better sample crystallinity.

The PL peak at ~480 nm, which is associated with the quantum wells, is much lower for the thermally annealed sample than that of the untreated sample. The x-ray irradiated sample, however, compared favorably to the untreated sample, thus indicating that the thermal annealing process degrades the quality of GaN-based structure in a way that x-ray irradiation does not. Moreover, for the x-ray irradiated samples, there is a strong peak at ~440 nm, which is associated with the activated Mg, thus indicating that x-ray irradiation yields much stronger Mg activation than no post-growth treatment and conventional thermal annealing.

Figure 7:
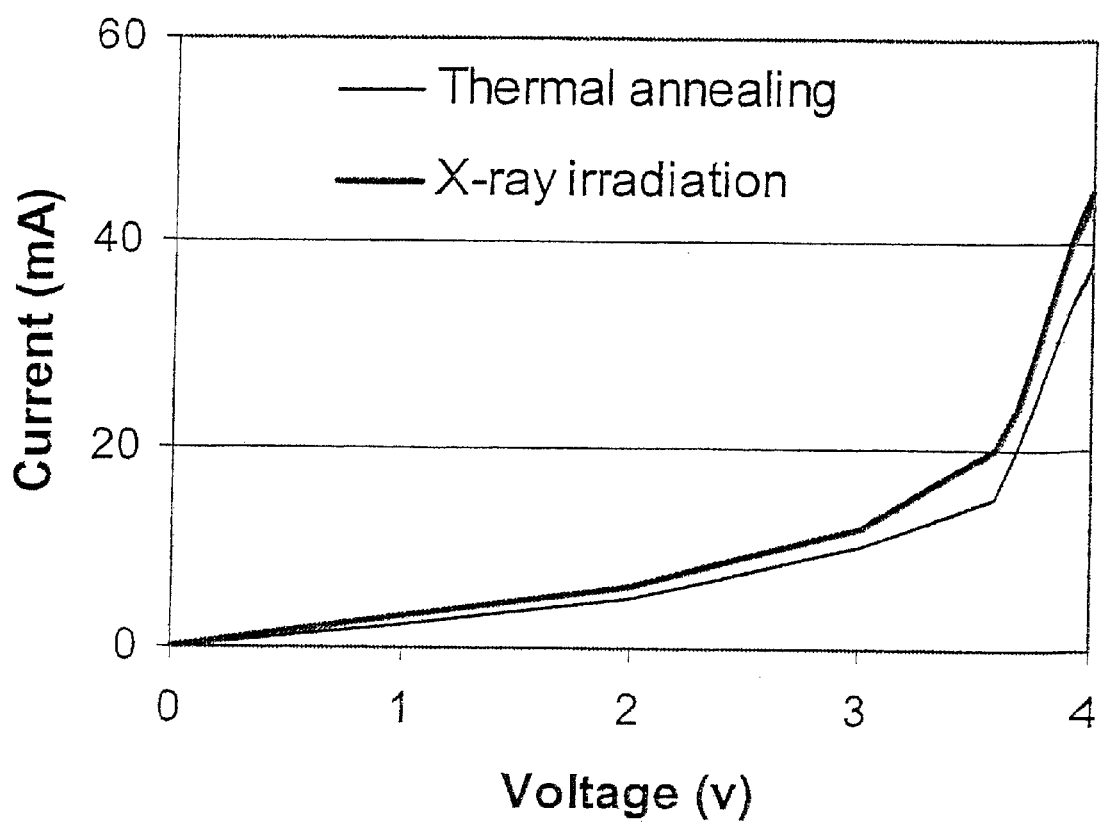
FIG. 7 is a graph illustrating the relationship between the current and forward bias voltage (I–V curve) of a GaN-based blue LED irradiated by x-ray radiation, and a GaN-based blue LED treated by conventional post-growth thermal annealing.

FIG. 7 is a graph showing the relationship between the current and forward bias voltage (I–V curve) for GaN-based blue LEDs treated by x-ray irradiation and conventional thermal annealing. As is apparent from the graph, the forward bias voltage (defined at 20 mA current) for the x-ray irradiated LEDs is 0.35 V, which is lower than the 0.37 V for the thermal-annealed LEDs. This is not surprising, considering that, as has been demonstrated above, the thermally annealed Mg-doped GaN layer has a lower carrier concentration, lower Hall mobility and degraded crystallinity relative to the comparable x-ray irradiated layer. As a result of these factors, the thermal annealing process produces a more resistive p-GaN layer, and accordingly, the forward bias voltage for the LED is higher.

Figure 8:
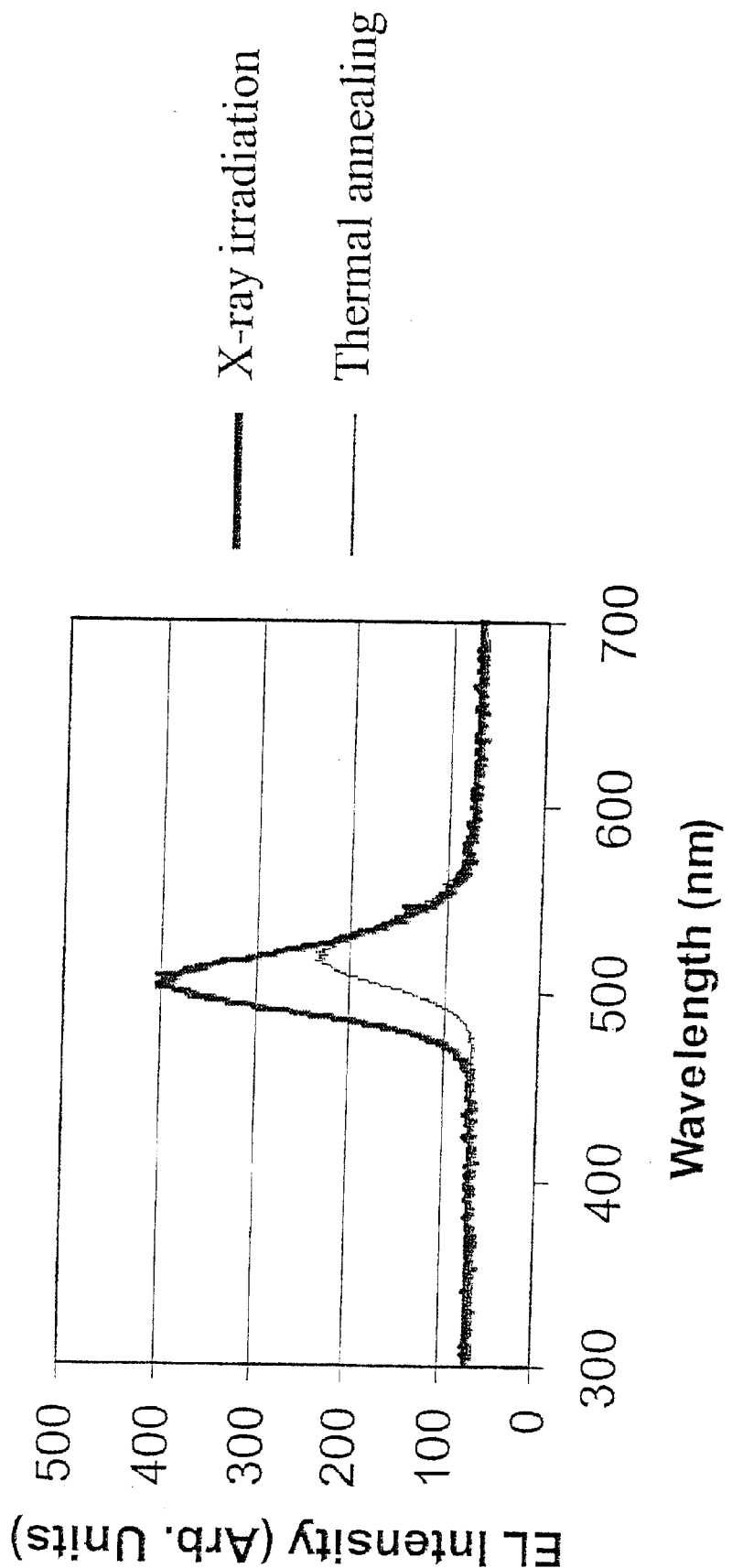
FIG. 8 is a graph comparing the electroluminescence (EL) spectra of a GaN-based blue LED irradiated by x-ray radiation and a GaN-based blue LED treated by conventional post-growth thermal annealing.

FIG. 8 is a graph comparing the electroluminescence (EL) spectra of GaN-based compound semiconductor blue LEDs fabricated by thermal annealing and x-ray irradiation. These LEDs were prepared in the same way as described above, with the same carrier concentration in the top p-GaN layer. The EL spectrum was measured by applying 20 mA current to GaN-based blue LEDs, and detecting the intensity of the illuminated light with a Si photodetector. As is apparent from FIG. 8, the EL intensity of the x-ray irradiated GaN-based blue LED is 50% higher than that of the thermally annealed LED.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of activating a dopant in a compound semiconductor comprising the step of:
    irradiating the compound semiconductor with x-ray radiation.

2. The method of claim 1, wherein the compound semiconductor comprises a III–V group compound.

3. The method of claim 2, wherein the III–V group compound comprises a GaN-based compound.

4. The method of claim 3, wherein the GaN-based compound is represented by the general formula $Ga_xAl_{1-x}N$, where $0 \leq x \leq 1$.

5. The method of claim 3, wherein the GaN-based compound is represented by the general formula $In_xGa_{1-x}N$, where $0 \leq x \leq 1$.

6. The method of claim 1, wherein the compound semiconductor is irradiated at approximately an ambient temperature.

7. The method of claim 1, wherein the compound semiconductor is irradiated in an ambient atmosphere.

8. The method of claim 1, further comprising forming a light emitting device with the compound semiconductor.

9. The method of claim 1, wherein the compound semiconductor is irradiated for a period in a range of 4–7 minutes.

10. The method of claim 1, wherein the duration of time of the x-ray irradiation is selected to maximize the carrier concentration of the compound semiconductor element.

11. The method of claim 1, comprising the additional step of:
    during the x-ray irradiation, changing the position of the compound semiconductor relative to the incident x-ray radiation to alter the incident angle of the x-ray radiation over a limited angular range.

12. The method of claim 10, wherein the limited angular range is approximately 5000 arc sec.

13. The method of claim 1, wherein the p-type dopant is Mg.

14. The method of claim 13, wherein the Mg concentration of a p-doped layer of the compound semiconductor is approximately $1 \times 10^{19}$ $cm^{-3}$.

15. The method of claim 14, wherein after the x-ray irradiation, the p-type carrier concentration of the compound semiconductor is approximately $1 \times 10^{18}$ $cm^{-3}$.

16. The method of claim 1, wherein the step of irradiating the compound semiconductor comprises:
    generating x-ray radiation with an x-ray source having an accelerating voltage of approximately 40 kV and an intensity of approximately 0.4 mA; and directing the x-ray radiation onto the surface of the compound semiconductor.

17. The method of claim 1, wherein the x-ray irradiates a p-type impurity doped region of the compound semiconductor to a depth of approximately 3 μm.

18. A method of fabricating a p-type compound semiconductor comprising the steps of:
    growing a compound semiconductor by using reaction gas containing p-type impurity; and
    irradiating the compound semiconductor with x-ray radiation to activate the p-type impurity.

19. The method of claim 18, wherein the compound semiconductor is grown by a metalorganic vapor phase deposition process.

20. A method of fabricating compound semiconductor light emitting diode (LED) comprising the steps of:
   growing a compound semiconductor LED structure by an epitaxial growth process; and
   irradiating the LED with x-ray radiation to activate a p-type impurity.

21. The method of claim 20, wherein the LED is a GaN-based LED.

22. The method of claim 20, wherein the LED is a blue LED.

23. The method of claim 20, wherein the LED is a blue LED is a blue-green LED.

24. The method of claim 20, wherein the LED is a blue LED is a green LED.

* * * * *